United States Patent
Wegmann (10) Patent No.: US 10,386,728 B2
(45) Date of Patent: Aug. 20, 2019

(54) DEVICE AND METHOD FOR WAVEFRONT ANALYSIS

(71) Applicant: Carl Zeiss SMT GmbH, Oberkochen (DE)

(72) Inventor: Ulrich Wegmann, Koenigsbronn (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/015,757

(22) Filed: Jun. 22, 2018

(65) Prior Publication Data

US 2018/0299782 A1 Oct. 18, 2018

Related U.S. Application Data

(63) Continuation of application No. PCT/EP2016/079136, filed on Nov. 29, 2016.

(30) Foreign Application Priority Data

Dec. 22, 2015 (DE) .................... 10 2015 226 571

(51) Int. Cl.
*G03F 7/20* (2006.01)
*G01M 11/02* (2006.01)

(52) U.S. Cl.
CPC ......... *G03F 7/706* (2013.01); *G01M 11/0221* (2013.01); *G01M 11/0271* (2013.01); *G01M 11/0285* (2013.01)

(58) Field of Classification Search
None
See application file for complete search history.

(56) References Cited

U.S. PATENT DOCUMENTS 5,062,705 A 11/1991 Takeo et al.
6,573,997 B1 6/2003 Goldberg et al.
(Continued)

FOREIGN PATENT DOCUMENTS

CN 104111120 A 10/2014
DE 10109929 A1 11/2001
(Continued)

OTHER PUBLICATIONS

GPTO Office Action for DE102015226571.4 with English translation, Sep. 1, 2016, 7 pages.
(Continued)

*Primary Examiner* — Michelle M Iacoletti
(74) *Attorney, Agent, or Firm* — Edell, Shapiro & Finnan, LLC (57) ABSTRACT

A device and a method for wavefront analysis. The device is designed for analyzing the wavefront of at least one light wave passing through an optical system, and has at least one illumination mask (105, 205, 305, 405, 406, 407), at least one first grating (120, 220, 320, 420), at least one second grating (130, 230, 330, 430) arranged in the predefined plane and at least one detector (140, 240, 340, 440) for detecting said superimposition pattern. The at least one first grating has at least one first grating structure and generates an interferogram in a predefined plane from a wavefront to be analyzed which proceeds from the illumination mask and passes through the optical system. The at least one second grating has at least one second grating structure and generates a superimposition pattern by the superimposition of the second grating structure with the interferogram generated by the first grating.

19 Claims, 7 Drawing Sheets

(56) References Cited

U.S. PATENT DOCUMENTS

| | | |
|---|---|---|
| 2006/0187435 A1 | 8/2006 | Yumiko |
| 2008/0062427 A1 | 3/2008 | Ohsaki |
| 2008/0144043 A1 | 6/2008 | Wegmann |
| 2008/0316448 A1 | 12/2008 | Ohsaki |
| 2012/0249985 A1 | 10/2012 | Wischmeier et al. |
| 2016/0131767 A1 | 5/2016 | Alleine et al. |
| 2016/0202118 A1* | 7/2016 | Ehrmann ............ G03F 7/70133 250/252.1 |

FOREIGN PATENT DOCUMENTS

| | | |
|---|---|---|
| DE | 10258142 A1 | 6/2004 |
| DE | 102011006468 A1 | 10/2012 |
| EP | 2207063 A1 | 7/2010 |
| JP | 2005183415 A | 7/2005 |
| JP | 2008098604 A | 4/2008 |
| JP | 2009004711 A | 1/2009 |
| JP | 2010206032 A | 9/2010 |
| JP | 2010206033 A | 9/2010 |
| JP | 2012145554 A | 8/2012 |
| WO | 0163233 A2 | 8/2001 |

OTHER PUBLICATIONS

PCT International Preliminary Report, PCT/EP2016/079136, dated Jun. 28, 2018, 7 pages.

Lin J-A et al., "Double Grating Interferometer with large lateral shear", Optik, Wissenschaftliche Verlag GmbH, vol. 84, No. 1, Jan. 1990, pp. 28-32.

McMorran, Benjamin J. et al., "An electron Talbot interferometer", Arxiv.org, Cornell University Library, 201 Olin Library Cornell University Ithaca, Dec. 2008.

International Search Report and Written Opinion in counterpart International Application No. PCT/EP2016/079136, dated Mar. 15, 2017, 14 pages.

JP Office Action, dated May 21, 2019, with English translation, 9 pages.

* cited by examiner

DEVICE AND METHOD FOR WAVEFRONT ANALYSIS

CROSS REFERENCE TO RELATED APPLICATIONS

The present application is a continuation of International Application No. PCT/EP2016/079136, filed Nov. 29, 2016, which claims the priority under 35 U.S.C. § 119(a) of the German Patent Application DE 10 2015 226 571.4 filed on Dec. 22, 2015. The disclosures of both related applications are considered part of and are incorporated by reference into the disclosure of the present application in their respective entireties.

FIELD OF THE INVENTION

The invention relates to a device and a method for wavefront analysis.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

Both in the projection lens and in the illumination device there is a need to analyze the wavefronts propagating through the respective optical system during operation, in order e.g. to obtain information about the actually achieved optical effect of the individual optical components of the relevant optical system and the alignment thereof with respect to one another. In this respect, the principle of shearing interferometry is known, inter alia, in which, through the use of a diffraction grating, identical copies of the wavefront to be measured are generated in accordance with the different orders of diffraction and are brought to superimposition. Said diffraction grating is generally positioned at the focus or near the focus. Positioning the diffraction grating outside the respective focus position gives rise to periodic superimposition patterns, so-called multi-stripe interference patterns. In the case of pure defocusing, i.e. the diffraction grating is situated outside the focus and the wavefront is at least approximately an ideal spherical wave, an interference pattern having a regular, possibly curved, stripe pattern arises. In the case of local deviations from the ideal spherical wavefront (local gradients), the (local) frequencies and phase angles of the stripes vary.

The problem can occur here in practice that the relevant interference pattern is no longer able to be resolved by available camera-based detectors, for instance on account of an excessively high stripe density or an excessively high spatial frequency. This may be the case, for example, if the respective wavefront analysis is intended to be carried out at different positions or field points within the relevant optical system at which a markedly aspherical setpoint wavefront is present or where particularly curvilinear interference stripes with a wide spectrum of spatial frequencies and possibly high stripe densities may occur.

Regarding the prior art, reference is made merely by way of example to DE 101 09 929 A1 and WO 01/63233 A2.

SUMMARY

Against the above background, it is an object of the present invention to provide a device and a method for wavefront analysis which enable a precise wavefront analysis at arbitrary positions or field points within the optical system. It is a further, related object to enable this even in the case of a greatly aspherical wavefront.

A device for wavefront analysis, which is designed for analyzing the wavefront of at least one light wave passing through an optical system, comprises:
at least one illumination mask,
at least one first grating, which has at least one first grating structure and generates an interferogram in a predefined plane from a wavefront to be analyzed which proceeds from the illumination mask and passes through the optical system,
at least one second grating arranged in said predefined plane, said at least one second grating having at least one second grating structure and generating a superimposition pattern by the superimposition of the second grating structure with the interferogram generated by the first grating, and
at least one detector for detecting said superimposition pattern.

Aspects of the present invention make use of the concept, in particular, of taking account of the problem described in the introduction, namely that of a high stripe density or high spatial frequency of an interference pattern that can be generated on the basis of shearing interferometry, and the resultant difficulties of a camera-based resolution of such an interference pattern, by virtue of the fact that for instance the relevant interference pattern itself in situ is not detected and analyzed by a camera-based detector. Rather, a grating structure which corresponds to said interference pattern or as it were represents the latter is positioned in the relevant plane. This has the consequence that a superimposition between the grating structure additionally used according to the invention and said interference pattern takes place analogously to the known Moiré effect, wherein the superimposition pattern arising here has, in a manner corresponding to the Moiré effect, a structure which, in comparison with the respectively superimposed structures (i.e. in comparison with the second grating structure used and also relative to the interference pattern) is comparatively "coarser" and has a low frequency (i.e. has a relatively lower spatial frequency), and can thus readily be resolved by an available camera-based detector.

In other words, the present invention includes the concept, instead of directly measuring an interference pattern generated through shearing interferometry with a specific diffraction grating, firstly calculating what interference pattern should be expected theoretically for the relevant wavefront with knowledge of the concrete properties of the optical system and the interferometric measuring arrangement (in particular wavelength and grating constant of the first grating), but then, instead of a direct measurement of said interference pattern, firstly producing a second grating corresponding thereto and positioning it in the relevant plane instead of a detector.

According to the invention, the superimposition pattern resulting from the superimposition of the specially produced second grating with the interference pattern is then measured, wherein a detector used for this purpose, owing to the significantly lower spatial frequency of the superimposition pattern that arose as a result of said superimposition, has to satisfy correspondingly lower requirements and a metrological resolution of the superimposition pattern thus becomes realizable.

To a certain extent the second grating additionally used according to the invention here can also be regarded as a "demodulator" with which the interference pattern initially predicted according to the invention, said interference pattern corresponding to the setpoint or expected value, is demodulated in order to determine as a result the deviation from said setpoint or expected value and thus possible wavefront aberrations by measuring the comparatively low-frequency superimposition pattern that arose as a result of the superimposition of the second grating with the interference pattern actually generated in the relevant plane.

Within the meaning of the present application, the term "grating" should preferably be understood to encompass structures arranged periodically at least in one direction.

In accordance with one embodiment, the second grating structure is different from the first grating structure.

In accordance with one embodiment, the at least one second grating structure is configured on the basis of a setpoint interference pattern which would be generated by the first grating for a setpoint wavefront of the light wave after passing through the optical system.

In accordance with one embodiment, the detector has a radiation-sensitive sensor.

In accordance with one embodiment, the detector has an imaging optical unit for imaging the superimposition pattern onto the radiation-sensitive sensor.

In accordance with one embodiment, the second grating is arranged on the radiation-sensitive sensor. As a result, an imaging optical unit for imaging the superimposition pattern generated in the capture plane onto a more remote radiation-sensitive sensor can be dispensed with and a more compact measurement set-up can be achieved.

In accordance with one embodiment, the second grating is arranged on a faceplate for the fibre-optic transmission of the superimposition pattern onto the radiation-sensitive sensor. Such a fibre-optic transmission makes it possible, for example, to arrange the radiation-sensitive sensor and possibly further electronic components used for evaluation outside a vacuum region in which the front side—carrying the second grating—of the faceplate may be situated.

In accordance with one embodiment, the radiation-sensitive sensor is arranged on a light exit surface of the faceplate.

In accordance with one embodiment, the second grating is arranged on a coherence-destroying substrate. As a result, it is possible to avoid undesired further interference phenomena which might otherwise occur in principle also downstream of the second grating relative to the light propagation direction. For this purpose, the relevant substrate may be embodied e.g. as a frequency-converting layer, or be embodied as a light-scattering element e.g. using a roughened surface or light-scattering inner structure.

In accordance with one embodiment, the device has a changer for exchanging the first grating structure generating the interferogram and/or a changer for exchanging the second grating structure superimposed with said interferogram. Changing the grating structure taking effect respectively in the region of the first grating and/or of the second grating makes it possible to chose, for different wavefronts (e.g. different positions or field points in the respective optical system), respectively suitable pairs of grating structures on the first grating and the second grating, that is to say to chose different assignments or permutations of locations on the first grating and locations on the second grating depending on the wavefronts or wavefront aberrations to be analyzed in each case.

In accordance with one embodiment, the second grating has a plurality of segments which differ from one another with regard to the second grating structure situated in the respective segment.

In accordance with one embodiment, the optical system has an optical system axis, wherein the first grating and/or the second grating are/is movable along said optical system axis.

In embodiments of the invention, it is also possible to measure different regions of the wavefront to be analyzed with different positioning of the first grating along the light propagation direction (z-direction) or mutually different focus settings, wherein the relevant partial wavefronts can then be combined. In this case, the defocusing that is adjustable through the positioning of the first grating along the light propagation direction (z-direction) and thus the stripe density in the interference pattern generated by the first grating can be varied in a suitable manner over the wavefront to be analyzed.

In accordance with one embodiment, the device has a plurality of measuring channels, wherein each of said measuring channels is assigned respectively a light source, an illumination mask, a first grating structure and a second grating structure. As a result, a greater precision can also be achieved besides a higher measurement speed. Furthermore, by using different wavelengths, it is also possible to obtain further information about the optical system or the optical components present therein (e.g. about occurring dispersion or layer properties).

In accordance with one embodiment, the optical system is an optical system for microlithography, in particular an optical system of a microlithographic projection exposure apparatus. In this case, the optical system can be, in particular, a subsystem of the illumination device or of the projection lens.

The invention furthermore relates to a method for wavefront analysis, wherein a wavefront of at least one light wave passing through an optical system is analyzed, wherein at least one first grating having at least one first grating structure generates an interferogram in a predefined plane from the wavefront to be analyzed, wherein at least one second grating arranged in said predefined plane and having at least one second grating structure generates a superimposition pattern by the superimposition of the second grating structure with the interferogram generated by the first grating, and wherein said superimposition pattern is detected by at least one detector.

In accordance with one embodiment, the at least one second grating structure is configured on the basis of a setpoint interference pattern which would be generated by the first grating for a setpoint wavefront of the light wave after passing through the optical system.

In accordance with one embodiment, the optical system has an optical system axis, wherein the method for analyzing different partial regions of a wavefront comprises at least one of the following steps:

variable positioning of the first grating along the optical system axis;

variation of the respectively effective grating structure of the first grating;

variable positioning of the second grating including the detector along the optical system axis; and variation of the respectively effective grating structure of the second grating.

In this case, partial wavefronts detected here can be combined in the analysis of the entire wavefront, that is to say that items of information obtained for the different partial regions of the wavefront can be combined for the analysis of the entire wavefront.

This is advantageous, for example, if the use of a single grating structure of the first grating and/or of the second grating does not suffice for analyzing a specific wavefront or for detecting the dynamic range present in the spatial frequency in the interference pattern respectively generated. In this case, a variable positioning of the first grating along the light propagation direction or optical system axis (for changing the defocusing), a variation of the respectively effective grating structure of the first grating (for changing the interference pattern, e.g. the stripe density), a variable positioning of the second grating including the detector along the light propagation direction or optical system axis and/or a variation of the respectively effective grating structure of the second grating can be performed. In this case, for example, segmented configurations of the first and/or second grating can be used in order, if appropriate, to detect and analyze in each case only a specific zone or partial wavefront, whereupon the items of information obtained or the relevant partial wavefronts can then be combined.

Further configurations of the invention can be gathered from the description and the dependent claims. The invention is explained in greater detail below on the basis of exemplary embodiments illustrated in the accompanying figures.

DETAILED DESCRIPTION

Figure 1:
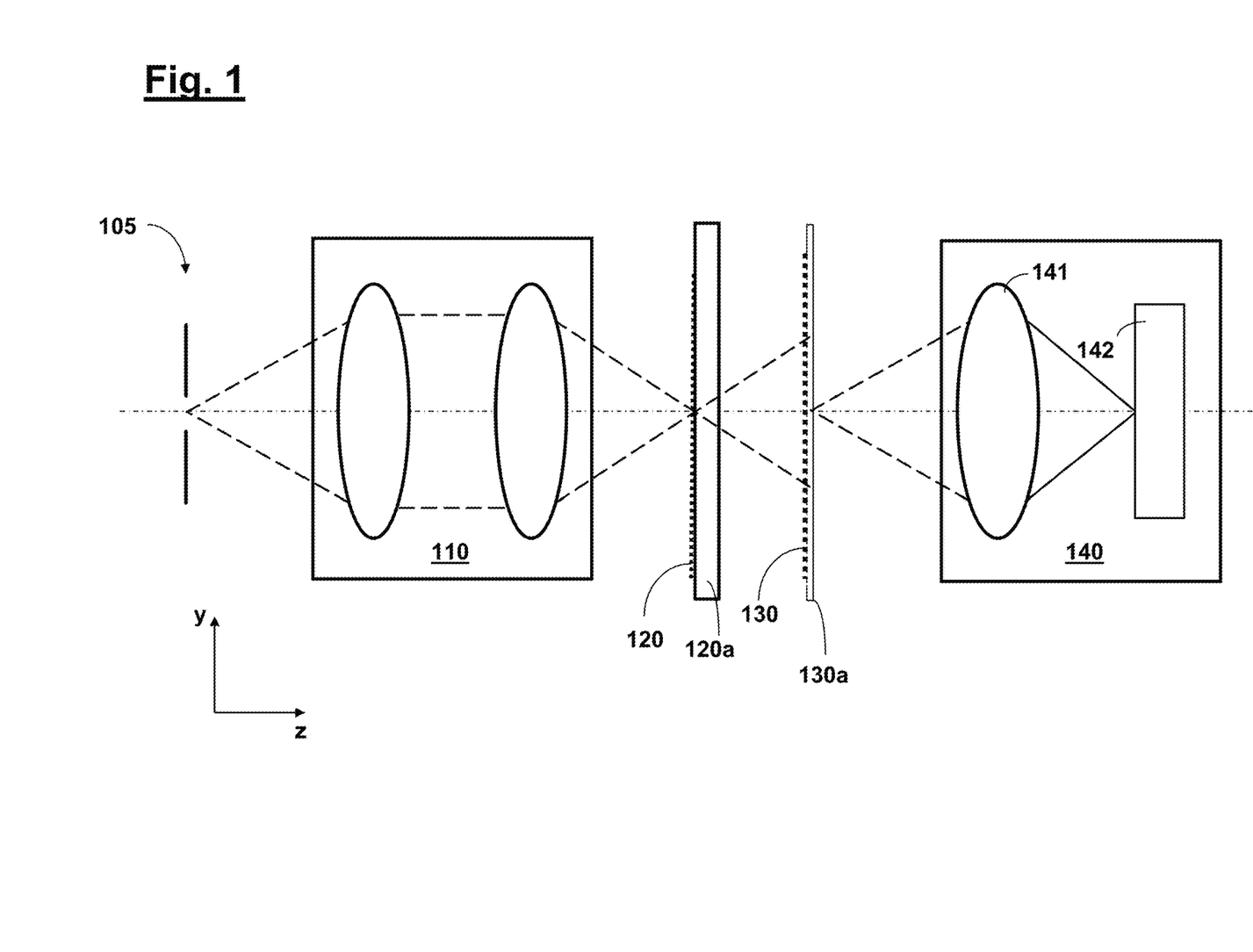
FIG. 1 shows a schematic illustration of one possible set-up of a device according to the invention for wavefront detection.

FIG. 1 firstly shows in schematic illustration the possible set-up of a device according to the invention for wavefront detection.

In FIG. 1, an imaging optical unit to be tested with regard to its wavefront effect is designated by "110", which may in particular also be an arbitrary subsystem of an illumination device or of a projection lens of a microlithographic projection exposure apparatus. For checking the wavefront effect of said imaging optical unit 110 or for analyzing the wavefront of a light wave passing through said imaging optical unit 110, the arrangement in accordance with FIG. 1 has an illumination mask 105 in the form of a perforated mask, through which light from a light source (not illustrated) enters the imaging optical unit 110 and is incident on a first grating 120 arranged downstream of the imaging optical unit 110 in the light propagation direction (z-direction in the coordinate system depicted).

Said first grating 120 has at least one first grating structure and is applied on a substrate, designated by "120a", which is sufficiently transparent to light having the operating wavelength. The light diffracted at the first grating 120 into different orders of diffraction (e.g. 0, +1st and −1st diffraction orders) generates an interference pattern in a (capture) plane arranged downstream of the first grating relative to the light propagation direction, the evaluation of which interference pattern in the case of a resolution by a camera-based sensor, in principle, would enable a wavefront analysis and thus a conclusion to be drawn about the optical effect or wavefront effect of the imaging optical unit 110 and e.g. an alignment of the optical components situated in the imaging optical unit 110 with respect to one another.

Depending on the constitution of the imaging optical unit 110, however, the wavefront effect of the imaging optical unit 110 may be constituted in such a way that the wavefront present at the exit of the imaging optical unit 110 is greatly aspherical. Furthermore, the abovementioned interference pattern generated by the first grating 120 in said capture plane—e.g. owing to a pronounced aspherical wavefront—may be of such high frequency or have such a high spatial frequency that a camera-based resolution of said interference pattern is not possible or is possible only with considerable outlay.

In order to overcome this problem, then, a second grating 130 is used according to the invention, said second grating being positioned in the relevant capture plane and in accordance with FIG. 1 likewise being embodied on a substrate 130a. Said second grating 130 is configured according to the invention precisely such that the sequence of light-transmissive and light-nontransmissive regions corresponds to that interference pattern which would be generated in the capture plane by the first grating 120 for a setpoint wavefront after passing through the imaging optical unit 110.

The grating structure of said second grating 130 is superimposed with the interferogram actually generated by the first grating 120 in the capture plane to form a comparatively low-frequency superimposition pattern analogously to the Moiré effect, wherein now said comparatively low-frequency superimposition pattern, unlike said interferogram generated by the first imaging grating 120, is accessible to a camera-based resolution.

In accordance with FIG. 1, the corresponding camera-based measurement is carried out by a detector 140 arranged downstream of the second grating 130 in the light propagation direction, said detector having, for its part, an imaging optical unit 141 and a radiation-sensitive sensor 142.

The measurement of the superimposition pattern that arose as a result of the superimposition of the second grating 130 with the interference pattern generated by the first grating 120 enables in turn an analysis with regard to the wavefront effect of the imaging optical unit 110 or the deviation of the wavefront actually present at the light exit thereof from the setpoint wavefront and thus the wavefront aberrations present.

The calculation of the interference pattern corresponding to the setpoint or expected value, said calculation being carried out for the accurate design of the second grating 130, can be performed by carrying out customary optical forward simulation in the imaging optical unit 110. The second grating 130 can be realized as an amplitude or transmission grating having a sequence of light-transmissive and light-nontransmissive regions. In further embodiments, the second grating 130 can also have an electronically drivable transmission function (e.g. as "LCD grating").

Figure 2A:
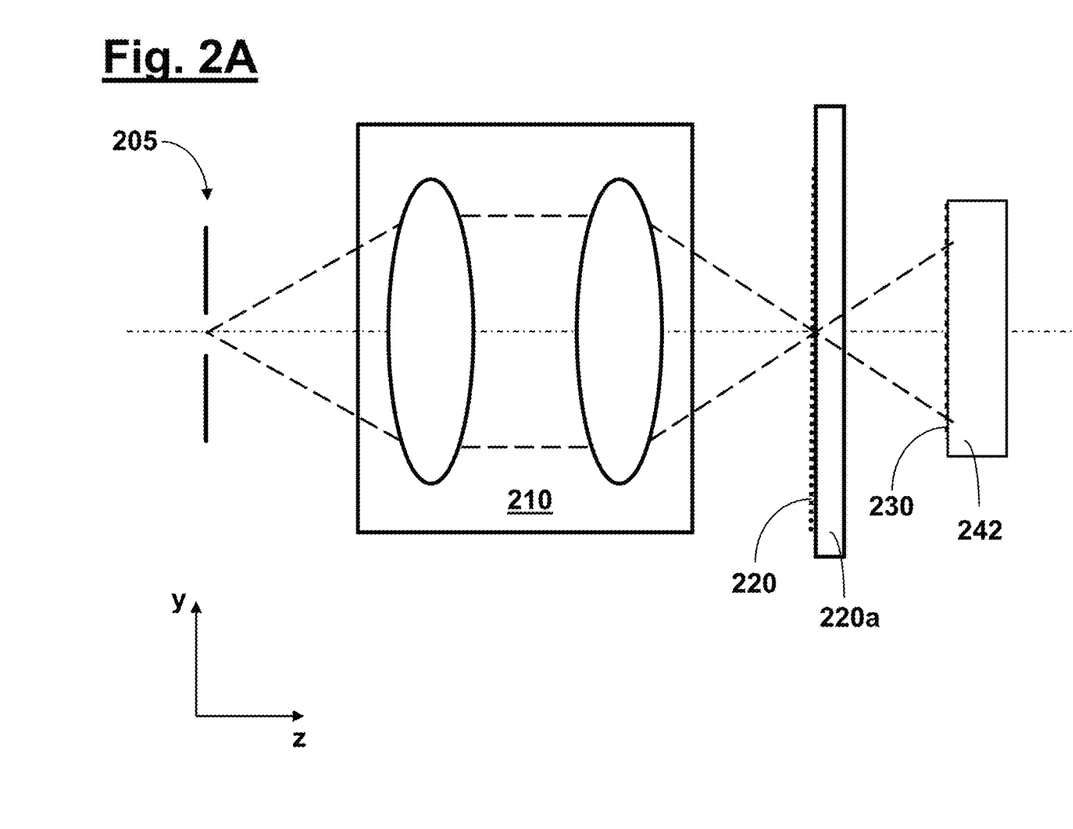
FIGS. 2A, 2B, 3 and 4 show schematic illustrations for describing further embodiments of a device according to the invention.

FIG. 2A shows a schematic illustration for elucidating a further embodiment, wherein components analogous or substantially functionally identical to FIG. 1 are designated by reference numerals increased by "100".

The embodiment in accordance with FIG. 2A differs from that from FIG. 1 in that the second grating 230 is arranged on the radiation-sensitive sensor 242, such that an imaging optical unit for imaging the superimposition pattern generated in the capture plane as described above onto a more remote radiation-sensitive sensor is dispensed with. A more compact measurement set-up is thereby achieved as a result.

Figure 2B:
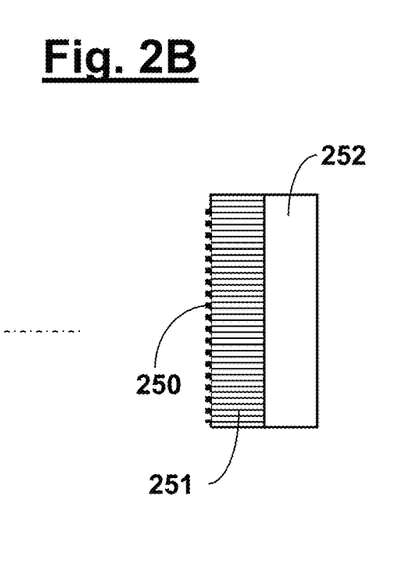

In accordance with FIG. 2B, the second grating (designated by "250" there) can also be arranged on a faceplate 251 for the fibre-optic transmission of said superimposition pattern onto the radiation-sensitive sensor (designated by "252" there) situated on the light exit surface of the faceplate 251.

Figure 3:
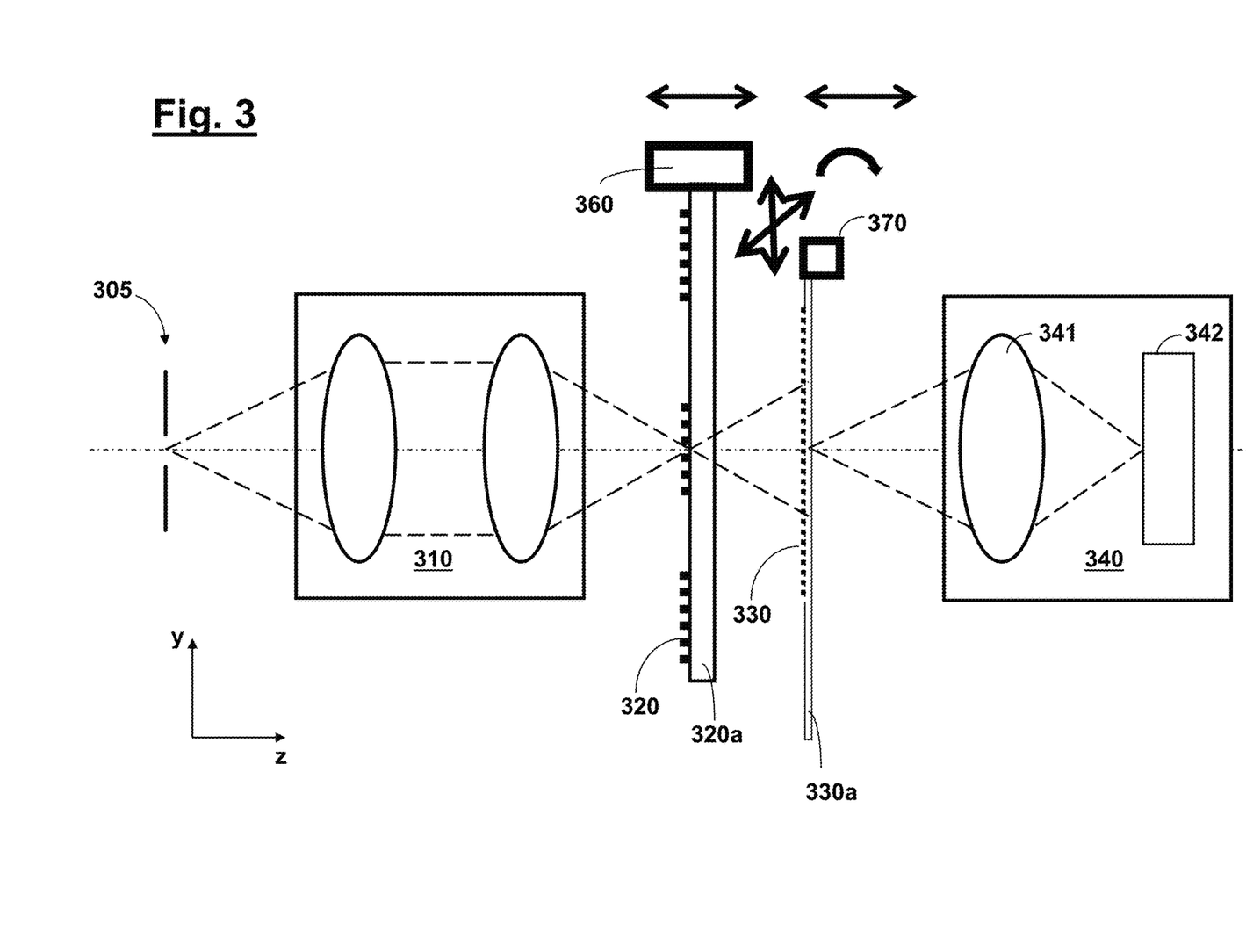

FIG. 3 serves for elucidating a further embodiment, wherein components analogous or substantially functionally identical to FIG. 1 are designated by reference numerals increased by "200".

In accordance with FIG. 3, both the first grating 320 and the second grating 330 are respectively assigned a manipulator 360 and 370, which makes it possible to change the grating structure currently taking effect in each case with a position manipulation (e.g. by rotation about the z-axis or light propagation direction) or displacement in a transverse direction with respect to the light propagation direction or z-axis. For this purpose, respectively different grating structures can be provided on the first grating 320 and the second grating 330, wherein gratings 530 or 630 having a plurality of segments can also be used, as indicated in FIG. 5 or FIGS. 6A-6C, wherein said segments differ from one another with regard to the grating structure respectively present. The first grating 320 and the second grating 330 can be displaceable as a group in the z-direction or be displaceable individually in the z-direction, as is indicated by the horizontal double-headed arrows in FIG. 3.

The above-described changing of the grating structure respectively taking effect in the region of the first grating or of the second grating makes it possible to chose, for different wavefronts (e.g. different positions or field points in the respective optical system), respectively suitable pairs of grating structures on the first grating and the second grating, that is to say to chose different assignments or permutations of locations on the first grating and locations on the second grating depending on the wavefront aberrations to be tested in each case. In this regard, merely by way of example for the case of the second grating 530 illustrated schematically in FIG. 5, a central region 531 without a grating structure can be provided if for instance in this region owing to a sufficiently low-frequency interference pattern to be analyzed, a camera-based resolution can be effected even without the concept according to the invention of superimposing said interference pattern with a second grating. Furthermore, other segments designated by "532", "533", "534" and "535", respectively, in FIG. 5, in accordance with a higher-frequency interference pattern respectively generated, can have grating structures having a different, higher grating constant.

The first grating and/or the second grating can also be equipped such that just by rotation about the z-axis different segments can be introduced into the respective beam path.

Figure 6A:
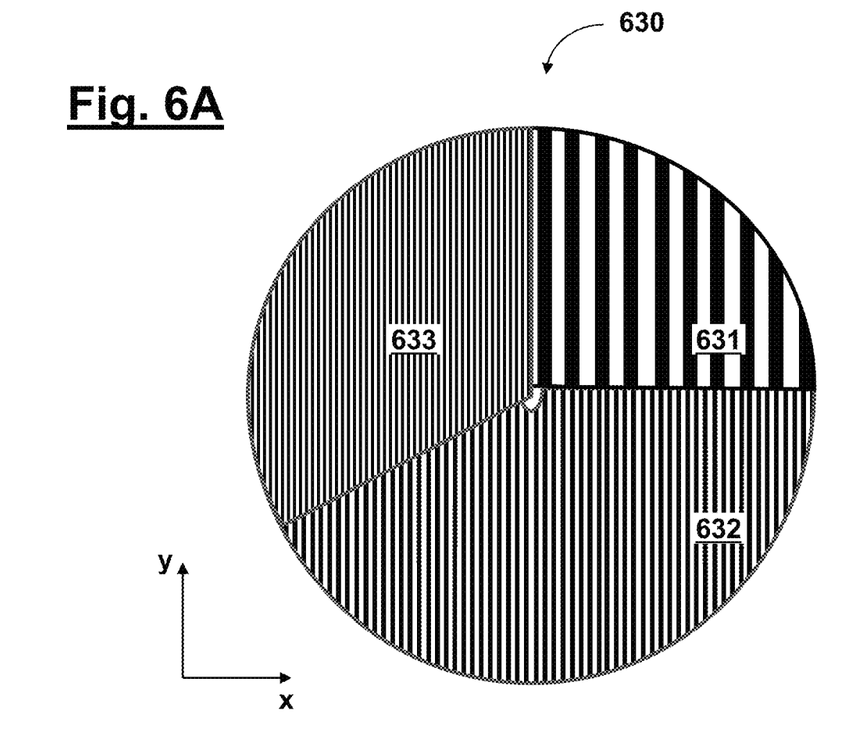

FIG. 6A schematically illustrates one possible configuration of a second grating 630 having segments 631, 632 and 633 having mutually different spatial frequencies in the grating structure. The segments 631, 632 and 633 can be embodied such that the spatial frequencies are adapted to the segments of a single wavefront. In this case, the segments 631, 632 and 633 can also be used sequentially, wherein the items of information respectively obtained can be combined sequentially.

Figure 6B:
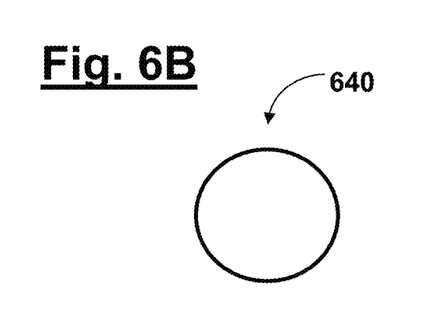
Figure 6C:
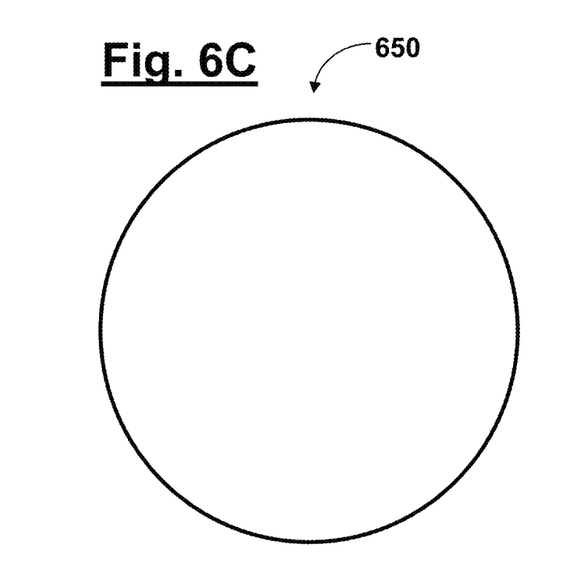

If the wavefront to be measured, in relation to the size of the second grating 630 from FIG. 6A, has an outer boundary 640 in accordance with FIG. 6B which "fits" into a respective one of the segments 631, 632 or 633, according to the invention if appropriate the complete pupil or wavefront or the superimposition pattern thus arising can be "decoded" with the relevant segment. By contrast, if the wavefront to be measured, in relation to the size of the second grating 630 from FIG. 6A, has an outer boundary 650 in accordance with FIG. 6C and in addition the segments 631, 632 and 633, with regard to the respective spatial frequencies in the grating structure, are configured in a manner precisely matching the setpoint wavefront, a simultaneous measurement of all zones of the wavefront can also be carried out with the correspondingly segmented grating 630.

Figure 7:
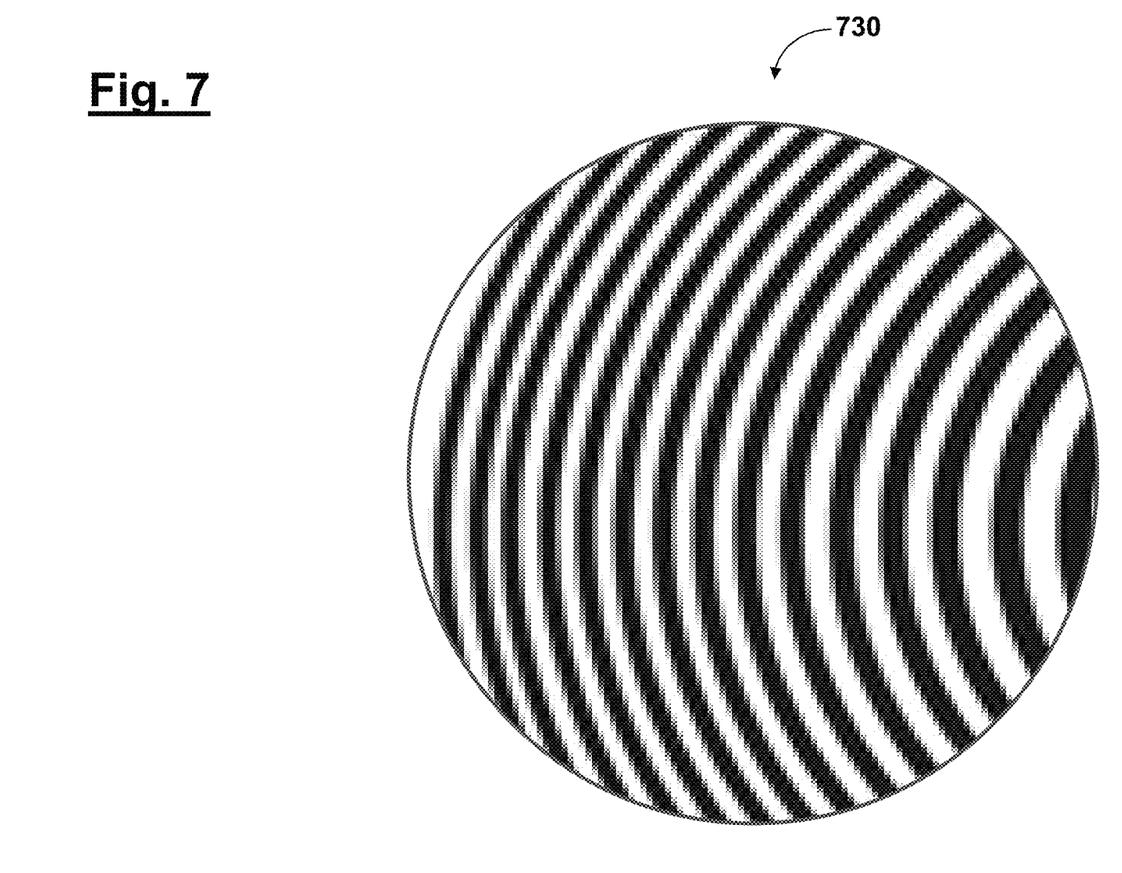

FIG. 7 shows merely by way of example a grating 730 having a curvilinear grating structure.

Figure 4:
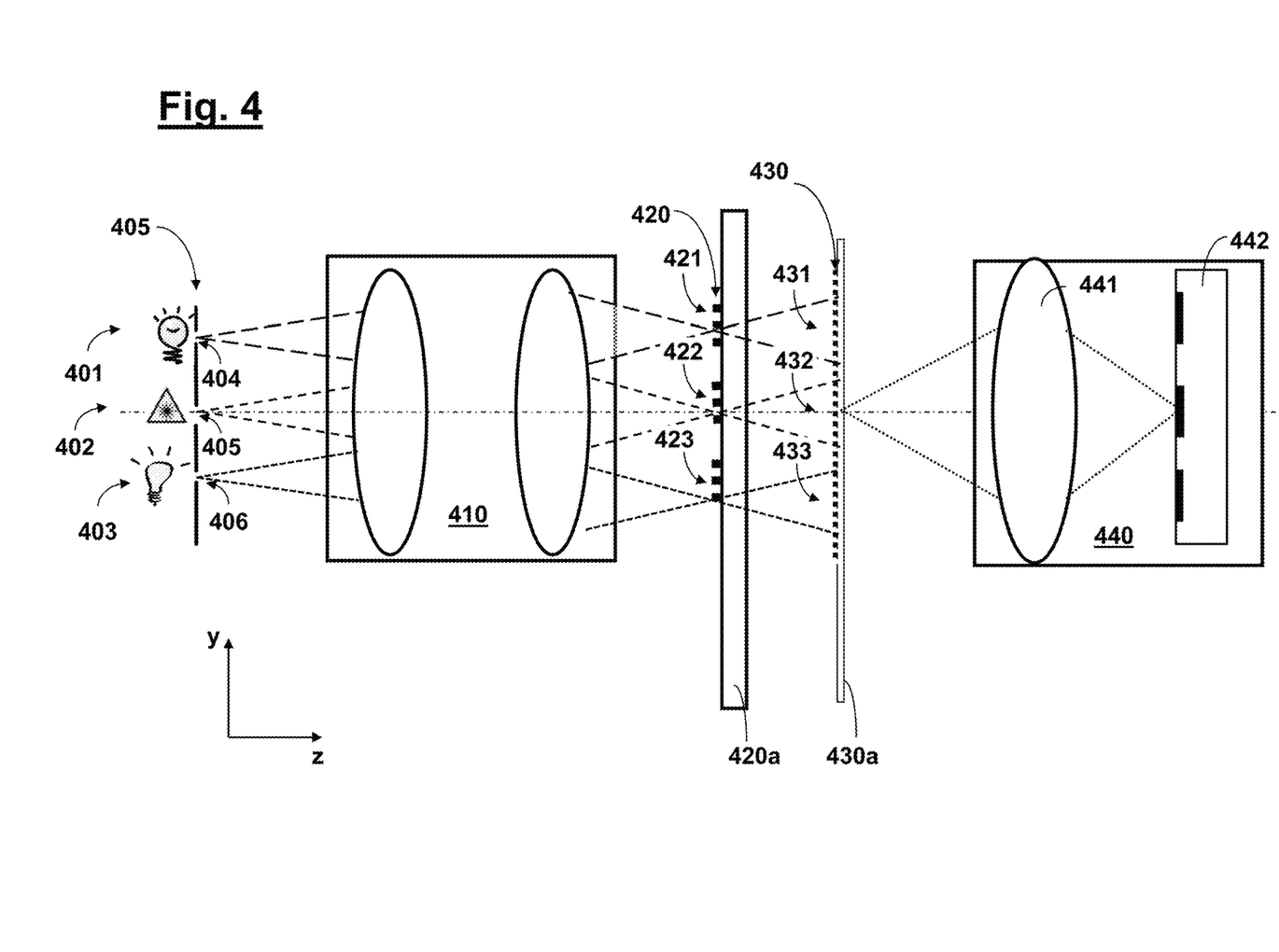
Figure 5:
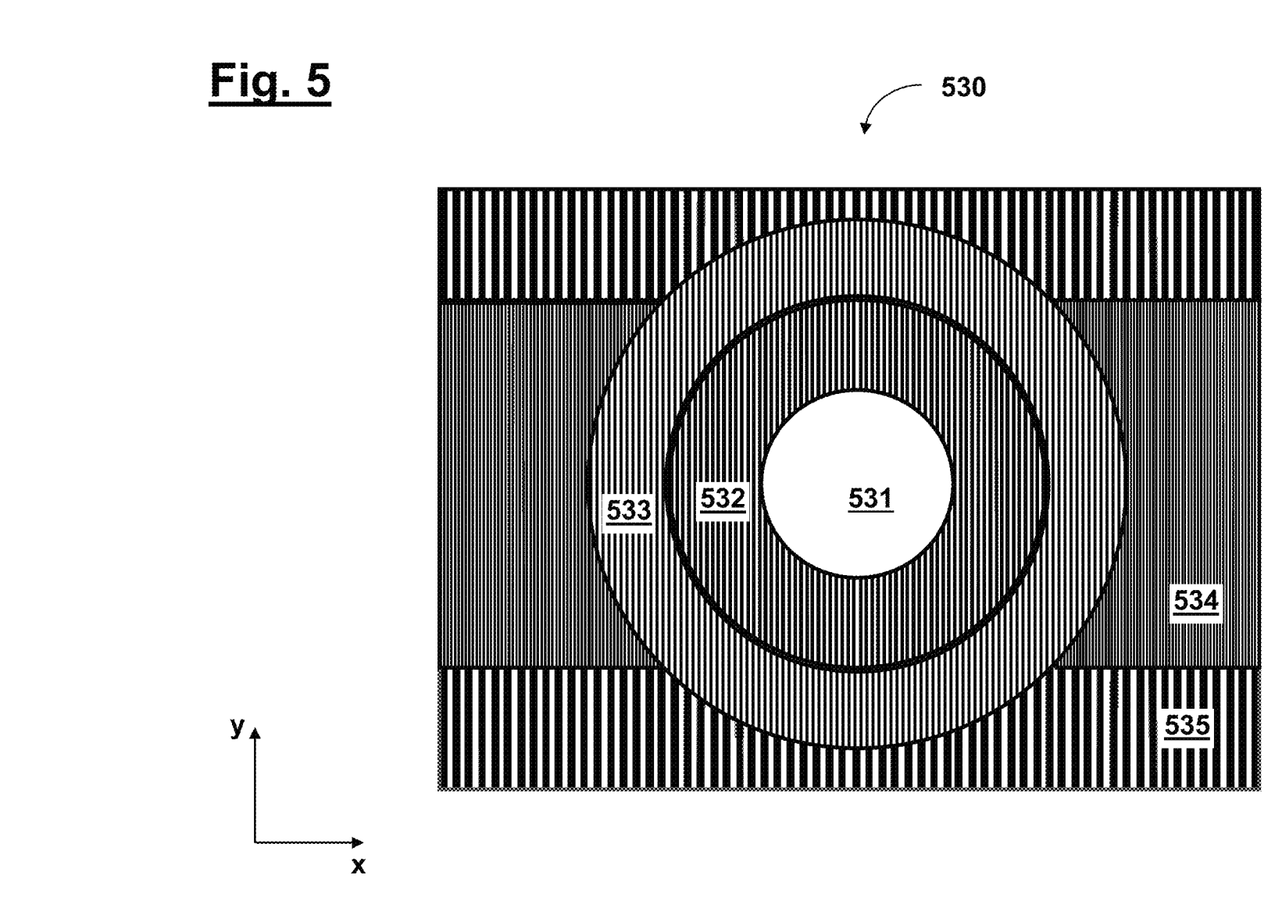
FIGS. 5, 6A-6C and 7 show schematic illustrations for describing exemplary embodiments of a grating that can be used in a device according to the invention.

FIG. 4 serves for elucidating a further possible embodiment, wherein in comparison with FIG. 1 analogous or substantially functionally identical components are designated by reference numerals increased by "300".

The arrangement in accordance with FIG. 4 differs from that from FIG. 1 in a multi-channel set-up, wherein each of a plurality of measurement channels is respectively assigned a light source 401, 402 or 403, an illumination mask 405, 406 or 407, a first grating structure 421, 422 or 423 and a second grating structure 431, 432 or 433. Consequently, even a relatively large field region can be measured simultaneously, without the need for serial scanning by the displacement of an illumination mask and of the respective gratings. As a result, a greater precision is also achieved besides a greater measurement speed. On the basis of the knowledge of the position of the measurement channels with respect to one another and since the respective illumination mask and first gratings are applied in each case on the object side and on the image side on a "carrier" or substrate, these channel positions represent a material measure in x-y- and z-directions. Given a matrix-like arrangement of the measurement channels, relative errors (measurement errors) of the individual channels with respect to one another can be detected and calibrated by lateral displacements by e.g. one channel position in the x- and/or y-direction. An in-situ calibration of the measuring unit is possible as a result. With regard to further configurations and advantages of the above-described configuration comprising a plurality of measurement channels, reference is made to WO 01/63233 A2.

As indicated in FIG. 4, the individual light sources 401, 402 and 403 can also have different wavelengths (wherein e.g. the wavefront analysis can be carried out with EUV light in one measurement channel and with light having a wavelength in the visible range in another measurement channel). In this way, e.g. conclusions can be drawn about layer properties on the optical components present in the imaging optical unit to be analyzed, or apodization minima can be determined in a wavelength-dependent and spatially resolved manner.

In embodiments, the substrate 130a on which the second grating 130 is arranged can also have coherence-destroying properties in order to avoid undesired further interference phenomena which might otherwise occur in principle also downstream of the second grating relative to the light propagation direction. For this purpose, the relevant substrate 130a may be embodied e.g. as a frequency-converting layer, or be embodied as a light-scattering element e.g. using a roughened surface or light-scattering inner structure.

Even though the invention has been described on the basis of specific embodiments, numerous variations and alternative embodiments are evident to the person skilled in the art, e.g. through combination and/or exchange of features of individual embodiments. Accordingly, such variations and alternative embodiments are concomitantly encompassed by the present invention, and the scope of the invention is restricted only within the meaning of the appended patent claims and equivalents thereof.

What is claimed is:

1. Device for wavefront analysis, configured to analyse a wavefront of at least one light wave passing through an optical system, comprising
at least one illumination mask;
at least one first grating, which has at least one first grating structure and is configured to generate an interferogram in a predefined plane from the wavefront being analysed, which proceeds from the illumination mask and passes through the optical system;
at least one second grating, which is arranged in the predefined plane, wherein the at least one second grating has at least one second grating structure and is configured to generate a superimposition pattern through superimposition of the second grating structure with the interferogram generated by the first grating; and
at least one detector configured to detect the superimposition pattern, wherein the second grating is arranged on a coherence-destroying substrate.

2. Device according to claim 1, wherein the second grating structure differs structurally from the first grating structure.

3. Device according to claim 1, wherein the at least one second grating structure is configured in accordance with a setpoint interference pattern which would be generated by the first grating for a setpoint wavefront of the light wave after passing through the optical system.

4. Device according to claim 1, wherein the detector comprises a radiation-sensitive sensor.

5. Device according to claim 4, wherein the detector further comprises an imaging optical unit configured to image the superimposition pattern onto the radiation-sensitive sensor.

6. Device according to claim 4, wherein the second grating is arranged on the radiation-sensitive sensor.

7. Device according to claim 4, wherein the second grating is arranged on a faceplate configured to fiber-optically transmit the superimposition pattern onto the radiation-sensitive sensor.

8. Device according to claim 7, wherein the radiation-sensitive sensor is arranged on a light exit surface of the faceplate.

9. Device according to claim 1, further comprising a changer configured to exchange the first grating structure configured to generate the interferogram.

10. Device according to claim 1, further comprising a changer configured to exchange the second grating structure superimposed with the interferogram generated by the first grating.

11. Device according to claim 1, wherein the optical system has an optical system axis, and wherein the first grating and/or the second grating are/is configured to move along the optical system axis.

12. Device according to claim 1, wherein the second grating comprises a plurality of mutually differing segments, which differ from one another with regard to the second grating structure situated in the respective segment.

13. Device according to claim 1, further comprising a plurality of measuring channels, wherein each of the measuring channels is assigned a respective light source, a respective illumination mask, a respective first grating structure, and a respective second grating structure.

14. Optical system for microlithography, comprising:
an imaging optical unit, and
a device configured to analyse a wavefront of at least one light wave passing through the optical unit, comprising
at least one illumination mask;
at least one first grating, which has at least one first grating structure and is configured to generate an interferogram in a predefined plane from the wavefront being analysed, which proceeds from the illumination mask and passes through the optical unit;
at least one second grating, which is arranged in the predefined plane, wherein the at least one second grating has at least one second grating structure and is configured to generate a superimposition pattern through superimposition of the second grating structure with the interferogram generated by the first grating; and
at least one detector configured to detect the superimposition pattern, wherein the detector comprises a radiation-sensitive sensor, and wherein the second grating is arranged on a faceplate configured to fiber-optically transmit the superimposition pattern into the radiation-sensitive sensor.

15. Optical system according to claim 14, configured as a microlithographic projection exposure apparatus.

16. Method for wavefront analysis, wherein a wavefront of at least one light wave passing through an optical system is analysed, comprising:
generating an interferogram in a predefined plane from the wavefront being analysed with at least one first grating having at least one first grating structure;
with at least one second grating arranged in the predefined plane and having at least one second grating structure, generating a superimposition pattern by superimposing the second grating structure with the interferogram generated by the first grating; and
detecting the superimposition pattern with at least one detector, wherein the second grating is arranged on a coherence-destroying substrate.

17. Method according to claim 16, wherein the at least one second grating structure is configured in accordance with a setpoint interference pattern which would be generated by the first grating for a setpoint wavefront of the light wave after passing through the optical system.

18. Method according to claim 16, wherein the optical system has an optical system axis, wherein the method for analysing different partial regions of a wavefront comprises at least one of:
variable positioning of the first grating along the optical system axis;
varying the respectively effective grating structure of the first grating;
variable positioning of the second grating including the detector along the optical system axis; and
varying the respectively effective grating structure of the second grating.

19. Method according to claim 18, further comprising combining partial wavefronts detected by the detector during the analysis of the entire wavefront.

* * * * *

UNITED STATES PATENT AND TRADEMARK OFFICE
CERTIFICATE OF CORRECTION

PATENT NO.         : 10,386,728 B2
APPLICATION NO.    : 16/015757
DATED              : August 20, 2019
INVENTOR(S)        : Wegmann

Page 1 of 1

It is certified that error appears in the above-identified patent and that said Letters Patent is hereby corrected as shown below:

In the Claims

Column 10, Line 30, Claim 14, delete "into" and insert -- onto -- therefor.

Signed and Sealed this
Fourteenth Day of July, 2020

Andrei Iancu
*Director of the United States Patent and Trademark Office*